(12) United States Patent
Sun et al.

(10) Patent No.: US 8,143,101 B2
(45) Date of Patent: Mar. 27, 2012

(54) SEMICONDUCTOR PACKAGE AND THE METHOD OF MAKING THE SAME

(75) Inventors: Yu-Ching Sun, Kaohsiung (TW); Ren-Yi Cheng, Kaohsiung (TW); Tsai Wan, Kaohsiung (TW); Chih-Hung Hsu, Kaohsiung (TW); Kuang-Hsiung Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 294 days.

(21) Appl. No.: 12/052,815

(22) Filed: Mar. 21, 2008

(65) Prior Publication Data

US 2008/0230887 A1 Sep. 25, 2008

(30) Foreign Application Priority Data

Mar. 23, 2007 (TW) .............................. 96110034 A

(51) Int. Cl.
*H01L 29/00* (2006.01)
(52) U.S. Cl. ........ 438/109; 438/613; 438/614; 257/686; 257/E21.502; 257/E23.069
(58) Field of Classification Search ................. 257/686, 257/E21.502, E23.069; 438/109, 613, 614
See application file for complete search history.

(56) References Cited

U.S. PATENT DOCUMENTS

| 5,128,831 A | 7/1992 | Fox, III et al. |
| 5,222,014 A | 6/1993 | Lin |
| 5,355,580 A | 10/1994 | Tsukada |
| 5,400,948 A | 3/1995 | Sajja et al. |
| 5,579,207 A | 11/1996 | Hayden et al. |
| 5,594,275 A | 1/1997 | Kwon et al. |
| 5,608,265 A | 3/1997 | Kitano et al. |
| 5,714,800 A | 2/1998 | Thompson |
| 5,726,493 A | 3/1998 | Yamashita et al. |
| 5,748,452 A | 5/1998 | Londa |

(Continued)

FOREIGN PATENT DOCUMENTS

JP 07335783 12/1995

(Continued)

OTHER PUBLICATIONS

Yoshida et al., A Study on Package Stacking Process for Package-on-Package (PoP) Electronic Components and Tech. Conf. (ECTC), May 2006, San Diego, CA.

(Continued)

*Primary Examiner* — Andy Huynh
(74) *Attorney, Agent, or Firm* — Cooley LLP

(57) ABSTRACT

The present invention relates to semiconductor package and the method of making the same. The method of the invention comprises the following steps: (a) providing a first substrate; (b) mounting a first chip onto a surface of the first substrate; (c) forming a plurality of conductive elements on the surface of the first substrate; (d) covering the conductive elements with a mold, the mold having a plurality of cavities accommodating top ends of each of the conductive elements; and (e) forming a first molding compound for encapsulating the surface of the first substrate, the first chip and parts of the conductive elements, wherein the height of the first molding compound is smaller than the height of each of the conductive elements. Thus, the first molding compound encapsulates the entire surface of the first substrate, so that the mold flush of the first molding compound will not occur, and the rigidity of the first substrate is increased.

21 Claims, 7 Drawing Sheets

U.S. PATENT DOCUMENTS

| | | | |
|---|---|---|---|
| 5,763,939 A | 6/1998 | Yamashita | |
| 5,844,315 A | 12/1998 | Melton et al. | |
| 5,861,666 A | 1/1999 | Bellaar | |
| 5,883,426 A | 3/1999 | Tokuno et al. | |
| 5,889,655 A | 3/1999 | Barrow | |
| 5,892,290 A | 4/1999 | Chakravorty et al. | |
| 5,973,393 A | 10/1999 | Chia et al. | |
| 5,985,695 A | 11/1999 | Freyman et al. | |
| 6,177,724 B1 | 1/2001 | Sawai | |
| 6,194,250 B1 | 2/2001 | Melton et al. | |
| 6,195,268 B1 | 2/2001 | Eide | |
| 6,303,997 B1 | 10/2001 | Lee | |
| 6,451,624 B1 | 9/2002 | Farnworth et al. | |
| 6,489,676 B2 | 12/2002 | Taniguchi et al. | |
| 6,501,165 B1 | 12/2002 | Farnworth et al. | |
| 6,614,104 B2 | 9/2003 | Farnworth et al. | |
| 6,740,546 B2 | 5/2004 | Corisis et al. | |
| 6,740,964 B2 | 5/2004 | Sasaki | |
| 6,787,392 B2 | 9/2004 | Quah | |
| 6,798,057 B2 | 9/2004 | Bolkin et al. | |
| 6,812,066 B2 | 11/2004 | Taniguchi et al. | |
| 6,815,254 B2 | 11/2004 | Mistry et al. | |
| 6,828,665 B2 | 12/2004 | Pu et al. | |
| 6,847,109 B2 | 1/2005 | Shim | |
| 6,861,288 B2 | 3/2005 | Shim et al. | |
| 6,888,255 B2 | 5/2005 | Murtuza et al. | |
| 6,924,550 B2 | 8/2005 | Corisis et al. | |
| 6,936,930 B2 | 8/2005 | Wang | |
| 6,974,334 B2 | 12/2005 | Hung | |
| 7,002,805 B2 | 2/2006 | Lee | |
| 7,015,571 B2 | 3/2006 | Chang et al. | |
| 7,026,709 B2 | 4/2006 | Tsai et al. | |
| 7,029,953 B2 | 4/2006 | Sasaki | |
| 7,034,386 B2 | 4/2006 | Kurita | |
| 7,049,692 B2 | 5/2006 | Nishimura et al. | |
| 7,061,079 B2 | 6/2006 | Weng et al. | |
| 7,071,028 B2 | 7/2006 | Koike et al. | |
| 7,185,426 B1 | 3/2007 | Hiner et al. | |
| 7,187,068 B2 * | 3/2007 | Suh et al. | 257/685 |
| 7,242,081 B1 | 7/2007 | Lee | |
| 7,262,080 B2 | 8/2007 | Go et al. | |
| 7,279,784 B2 | 10/2007 | Liu | |
| 7,279,789 B2 | 10/2007 | Cheng | |
| 7,288,835 B2 | 10/2007 | Yim et al. | |
| 7,309,913 B2 | 12/2007 | Shim et al. | |
| 7,345,361 B2 | 3/2008 | Mallick et al. | |
| 7,354,800 B2 | 4/2008 | Carson | |
| 7,364,945 B2 | 4/2008 | Shim et al. | |
| 7,364,948 B2 * | 4/2008 | Lai et al. | 438/112 |
| 7,365,427 B2 | 4/2008 | Lu et al. | |
| 7,372,141 B2 | 5/2008 | Karnezos et al. | |
| 7,372,151 B1 | 5/2008 | Fan et al. | |
| 7,408,244 B2 | 8/2008 | Lee et al. | |
| 7,417,329 B2 | 8/2008 | Chuang et al. | |
| 7,429,786 B2 | 9/2008 | Karnezos et al. | |
| 7,429,787 B2 | 9/2008 | Karnezos et al. | |
| 7,436,055 B2 | 10/2008 | Hu | |
| 7,436,074 B2 | 10/2008 | Pan et al. | |
| 7,473,629 B2 | 1/2009 | Tai et al. | |
| 7,485,970 B2 | 2/2009 | Hsu et al. | |
| 7,550,832 B2 | 6/2009 | Weng et al. | |
| 7,550,836 B2 | 6/2009 | Chou et al. | |
| 7,560,818 B2 | 7/2009 | Tsai | |
| 7,586,184 B2 | 9/2009 | Hung et al. | |
| 7,589,408 B2 | 9/2009 | Weng et al. | |
| 7,633,765 B1 | 12/2009 | Scanlon et al. | |
| 7,642,133 B2 | 1/2010 | Wu et al. | |
| 7,671,457 B1 | 3/2010 | Hiner et al. | |
| 7,719,094 B2 | 5/2010 | Wu et al. | |
| 7,723,839 B2 | 5/2010 | Yano et al. | |
| 7,737,539 B2 | 6/2010 | Kwon et al. | |
| 7,737,565 B2 | 6/2010 | Coffy | |
| 7,777,351 B1 | 8/2010 | Berry et al. | |
| 7,838,334 B2 | 11/2010 | Yu et al. | |
| 2003/0129272 A1 * | 7/2003 | Shen et al. | 425/123 |
| 2004/0106232 A1 | 6/2004 | Sakuyama et al. | |
| 2004/0124515 A1 * | 7/2004 | Tao et al. | 257/684 |
| 2004/0126927 A1 | 7/2004 | Lin et al. | |
| 2004/0191955 A1 | 9/2004 | Joshi et al. | |
| 2005/0054187 A1 | 3/2005 | Ding et al. | |
| 2005/0117835 A1 | 6/2005 | Nguyen et al. | |
| 2005/0121764 A1 * | 6/2005 | Mallik et al. | 257/686 |
| 2006/0035409 A1 * | 2/2006 | Suh et al. | 438/109 |
| 2006/0170112 A1 | 8/2006 | Tanaka et al. | |
| 2006/0220210 A1 | 10/2006 | Karnezos et al. | |
| 2006/0240595 A1 | 10/2006 | Lee | |
| 2006/0244117 A1 | 11/2006 | Karnezos et al. | |
| 2007/0029668 A1 * | 2/2007 | Lin et al. | 257/723 |
| 2007/0090508 A1 * | 4/2007 | Lin et al. | 257/686 |
| 2007/0108583 A1 | 5/2007 | Shim et al. | |
| 2007/0241453 A1 | 10/2007 | Ha et al. | |
| 2007/0273049 A1 * | 11/2007 | Khan et al. | 257/787 |
| 2007/0290376 A1 | 12/2007 | Zhao et al. | |
| 2008/0017968 A1 | 1/2008 | Choi et al. | |
| 2008/0073769 A1 | 3/2008 | Wu et al. | |
| 2008/0116574 A1 | 5/2008 | Fan | |
| 2010/0000775 A1 | 1/2010 | Shen et al. | |
| 2010/0032821 A1 | 2/2010 | Pagaila et al. | |
| 2010/0171205 A1 | 7/2010 | Chen et al. | |
| 2010/0171206 A1 | 7/2010 | Chu et al. | |
| 2010/0171207 A1 | 7/2010 | Shen et al. | |
| 2011/0049704 A1 | 3/2011 | Sun et al. | |
| 2011/0117700 A1 | 5/2011 | Weng et al. | |
| 2011/0156251 A1 | 6/2011 | Chu et al. | |
| 2011/0241193 A1 | 10/2011 | Ding et al. | |

FOREIGN PATENT DOCUMENTS

| | | |
|---|---|---|
| JP | 2000294720 | 10/2000 |
| JP | 2001298115 | 10/2001 |
| JP | 2002158312 | 5/2002 |
| JP | 2002170906 | 6/2002 |
| JP | 2004327855 | 11/2004 |
| JP | 2009054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 4/2006 |

OTHER PUBLICATIONS

Dreiza et al., "High Density PoP (Package-on-Package) and Package Stacking Development" Electronic Components and Technology Conf. (May 2007).

* cited by examiner

SEMICONDUCTOR PACKAGE AND THE METHOD OF MAKING THE SAME

BACKGROUND OF THE INVENTION

1. Field of the Invention

The present invention relates to a semiconductor package and the method of making the same, and more particularly to a stacked semiconductor package and the method of making the same.

2. Description of the Related Art

FIGS. 1 to 7 are schematic views of each step of the method of making a conventional stacked semiconductor package. First, referring to FIG. 1, a first substrate 10 is provided. The first substrate 10 has a first surface 101 and a second surface 102. Afterward, a first chip 11 is mounted onto the first surface 101 of the first substrate 10, and is electrically connected to the first substrate 10 via a plurality of first wires 12.

In FIG. 2, a mold 13 is used to cover the first surface 101 of the first substrate 10. The mold 13 has a cavity 131 for accommodating the first chip 11 and the first wires 12.

As shown in FIG. 3, a molding process is performed to encapsulate the first chip 11 and the first wires 12 by injecting a first molding compound 14 into the cavity 131. Afterward, the mold 13 is removed.

In FIG. 4, a ball-mounting process is performed to form a plurality of first solder balls 15 on the first surface 101 of the first substrate 10, which is not covered by the first molding compound 14.

In FIG. 5, a second package 16 is provided. The second package comprises a second substrate 17, a second chip 18, a plurality of second wires 19, a second molding compound 20 and a plurality of third solder balls 21. The second substrate 17 has a first surface 171 and a second surface 172. The second chip 18 is electrically connected to the first surface 171 of the second substrate 17 via the second wires 19. The third solder balls 21 are disposed on the second surface 172 of the second substrate 17.

In FIG. 6, the third solder balls 21 are stacked on the first solder balls 15, and a reflow process is performed to form a plurality of fourth solder balls 22 by melting the third solder balls 21 and the first solder balls 15.

In FIG. 7, a plurality of second solder balls 23 is formed on the second surface 102 of the first substrate 10 to form a stacked package.

The conventional stacked package has the following disadvantages. In the above-mentioned molding process, the mold flush occurs easily, that is, the first molding compound 14 easily flush out of the cavity 131, and enters the space between the mold 13 and the first surface 101 of the first substrate 10. Therefore, the area for mounting the first solder balls 15 is polluted, causing the failure of the ball-mounting process and defects in the package. Moreover, the rigidity of the first substrate 10 is relatively low. After the third solder balls 171 and the first solder balls 15 are melted to form a plurality of fourth solder balls 22, a stress is produced on the first substrate 10. Therefore, the first substrate 10 is pulled so that warpage occurs.

Therefore, it is necessary to provide an innovative and advanced semiconductor package to solve the above problems.

SUMMARY OF THE INVENTION

The present invention is mainly directed to a method of making a semiconductor package which comprises the following steps: (a) providing a first substrate having a first surface and a second surface; (b) mounting a first chip onto the first surface of the first substrate, the first chip being electrically connected to the first substrate; (c) forming a plurality of conductive elements on the first surface of the first substrate; (d) covering the conductive elements with a mold, the mold having a plurality of cavities corresponding to top ends of the conductive elements; and (e) forming a first molding compound for encapsulating the first surface of the first substrate, the first chip and parts of the conductive elements, wherein the height of the first molding compound is smaller than the height of each of the conductive elements.

The present invention is further directed to a semiconductor package, which comprises a first substrate, a first chip, a second substrate, a second chip, a plurality of fourth solder balls and a first molding compound. The first substrate has a first surface and a second surface. The first chip is mounted onto the first surface of the first substrate, and is electrically connected to the first substrate. The second substrate has a first surface and a second surface. The second chip is mounted onto the first surface of the second substrate, and is electrically connected to the second substrate. The fourth solder balls connect the second surface of the second substrate and the first surface of the first substrate. The first molding compound encapsulates the first surface of the first substrate, the chip and parts of the fourth solder balls, and the height of the first molding compound is smaller than the height of each of the fourth solder balls. Thus, in the present invention, the first molding compound encapsulates the entire first surface of the first substrate, so that the mold flush of the first molding compound will not occur, and the rigidity of the first substrate is increased.

DETAILED DESCRIPTION OF THE INVENTION

Figure 1:
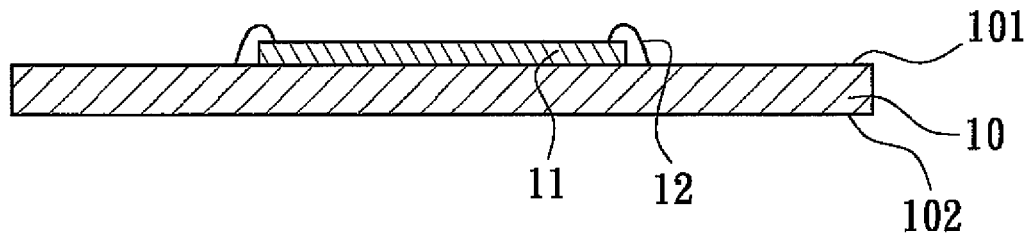
FIGS. 1 to 7 are schematic views of each step of the method of making the conventional stacked semiconductor package.
Figure 2:
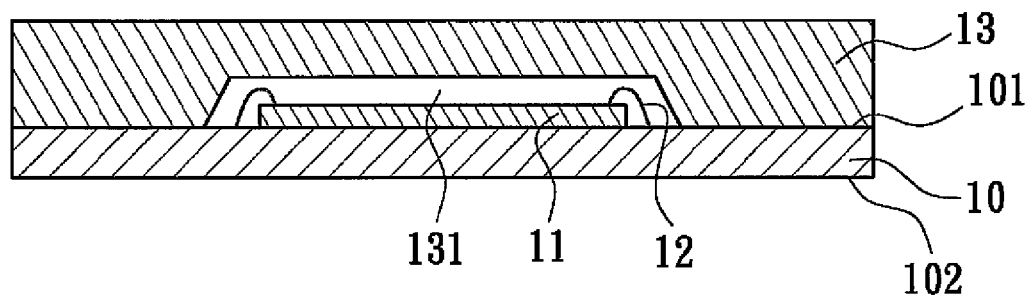
Figure 3:
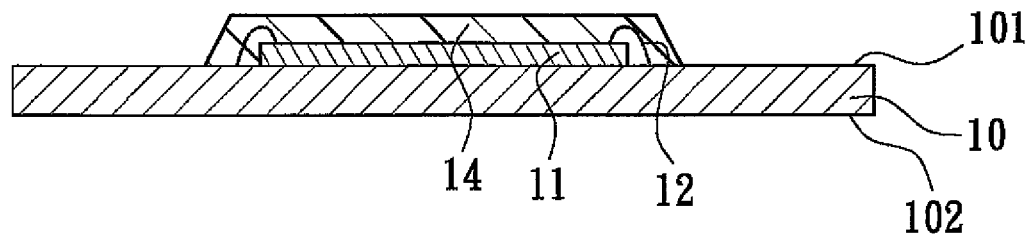
Figure 4:
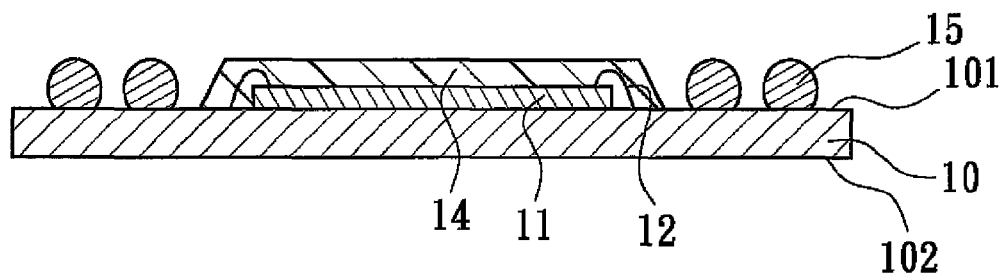
Figure 5:
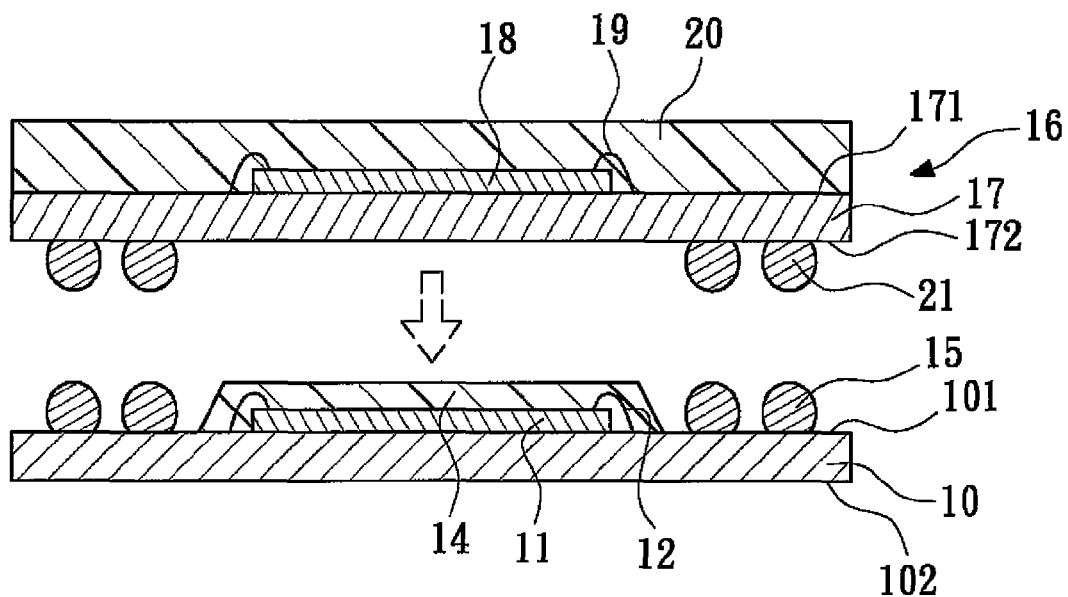
Figure 6:
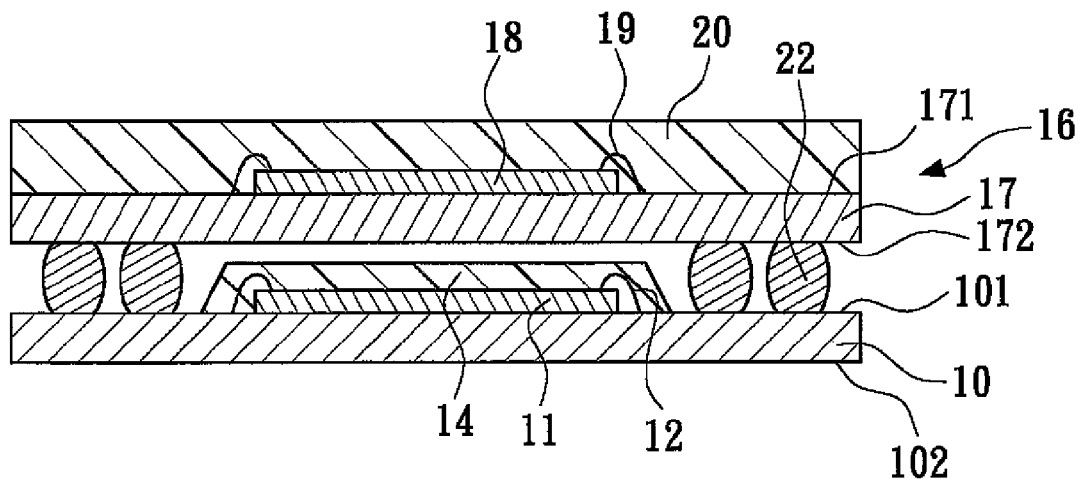
Figure 7:
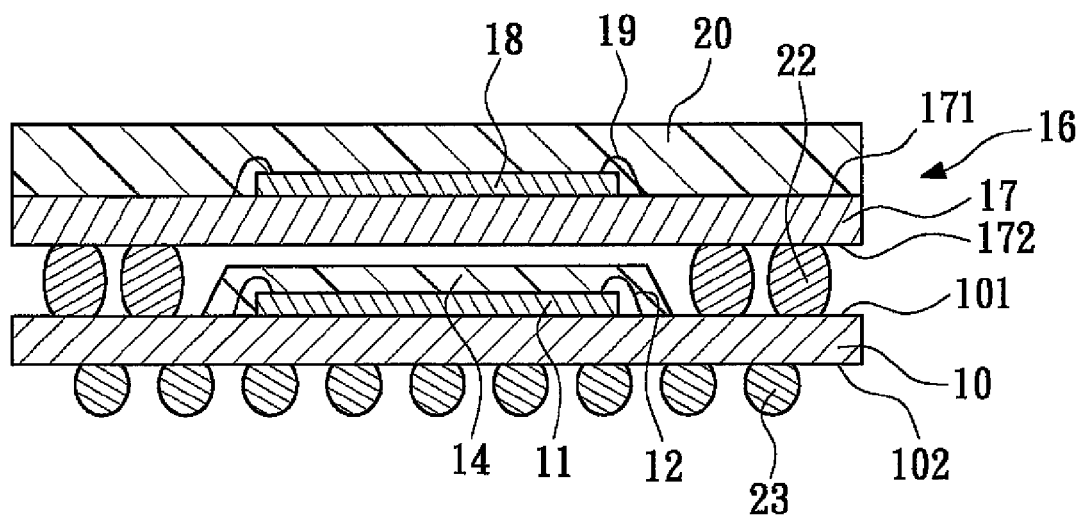
Figure 8:
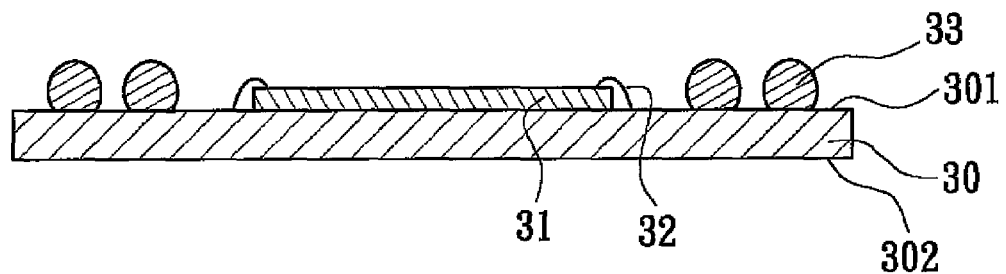
FIGS. 8 to 13 are schematic views of each step of the method of making a semiconductor package according to the first embodiment of the present invention.

FIGS. 8 to 13 are schematic views of each step of the method of making a semiconductor package according to the first embodiment of the present invention. In FIG. 8, a first substrate 30 having a first surface 301 and a second surface 302 is provided. Afterward, a first chip 31 is mounted onto the first surface 301 of the first substrate 30, and is electrically connected to the first substrate 30. In the embodiment, the first chip 31 is electrically connected to the first substrate 30 via a plurality of first wires 32. Afterward, a plurality of conductive elements 33 is formed on the first surface 301 of the first substrate 30. In the embodiment, the conductive elements 33 are a plurality of first solder balls, which are spherical.

Figure 9:
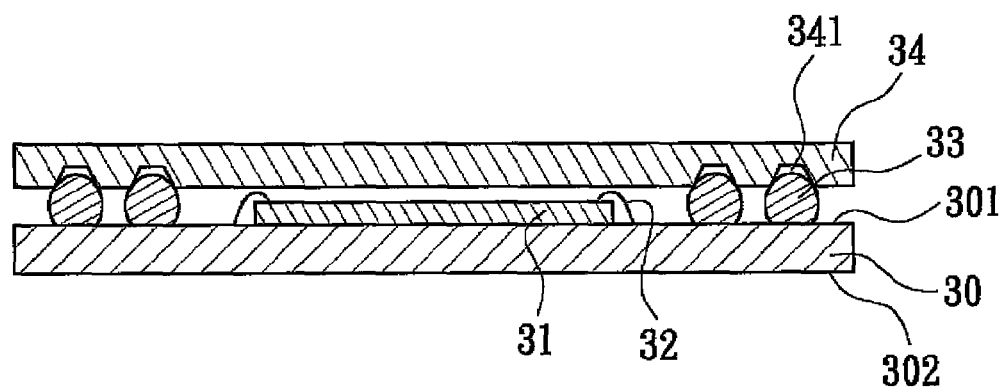

In FIG. 9, a mold 34 is used to cover the conductive elements 33. The mold 34 has a plurality of cavities 341. Each of the cavities 341 accommodates top ends of each of the conductive elements 33, and top ends of the conductive elements 33 contact with the cavities 341.

Figure 10:
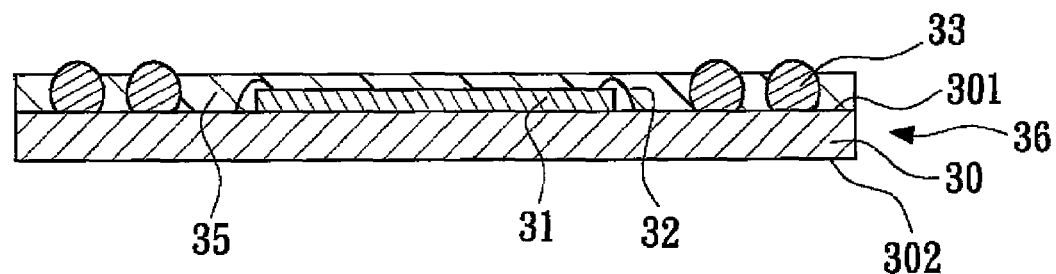

In FIG. 10, a molding process is performed to encapsulate the first surface 301 of the first substrate 30, the first chip 31, the first wires 32 and parts of the conductive elements 33 by forming a first molding compound 35, wherein the height of the first molding compound 35 is smaller than the height of each of the conductive elements 33, so as to expose top ends of the conductive elements 33 out of the first molding compound 35. After the first molding compound 35 is solidified, the mold 34 is removed to form a first semiconductor package 36.

Also in FIG. 10, the first semiconductor package 36 comprises a first substrate 30, a first chip 31, a plurality of conductive elements 33 and a first molding compound 35. The first substrate 30 has a first surface 301 and a second surface 302. The first chip 31 is mounted onto the first surface 301 of the first substrate 30, and is electrically connected to the first substrate 30. In the embodiment, the first chip 31 is electrically connected to the first substrate 30 via a plurality of first wires 32.

The conductive elements 33 are disposed on the first surface 301 of the first substrate 30. In the embodiment, the conductive elements 33 are a plurality of first solder balls. The first molding compound 35 encapsulates the first surface 301 of the first substrate 30, the first chip 31 and parts of the conductive elements 33, wherein the height of the first molding compound 35 is smaller than the height of each of the conductive elements 33, that is, top ends of the conductive elements 33 protrude out of the first molding compound 35.

In the semiconductor package 36, the first molding compound 35 encapsulates the entire first surface 301 of the first substrate 30, so that the mold flush of the first molding compound 35 will not occur, and the rigidity of the first substrate 30 is increased. The semiconductor package 36 may further perform the following processes.

Figure 11:
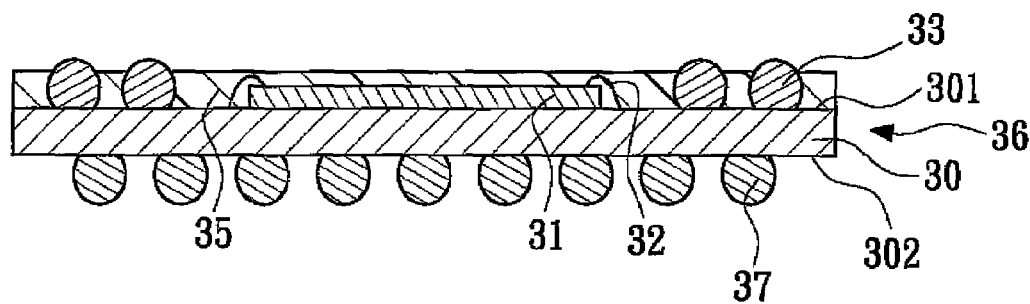

In FIG. 11, a plurality of second solder balls 37 is formed on the second surface 302 of the first substrate 30.

Figure 12:
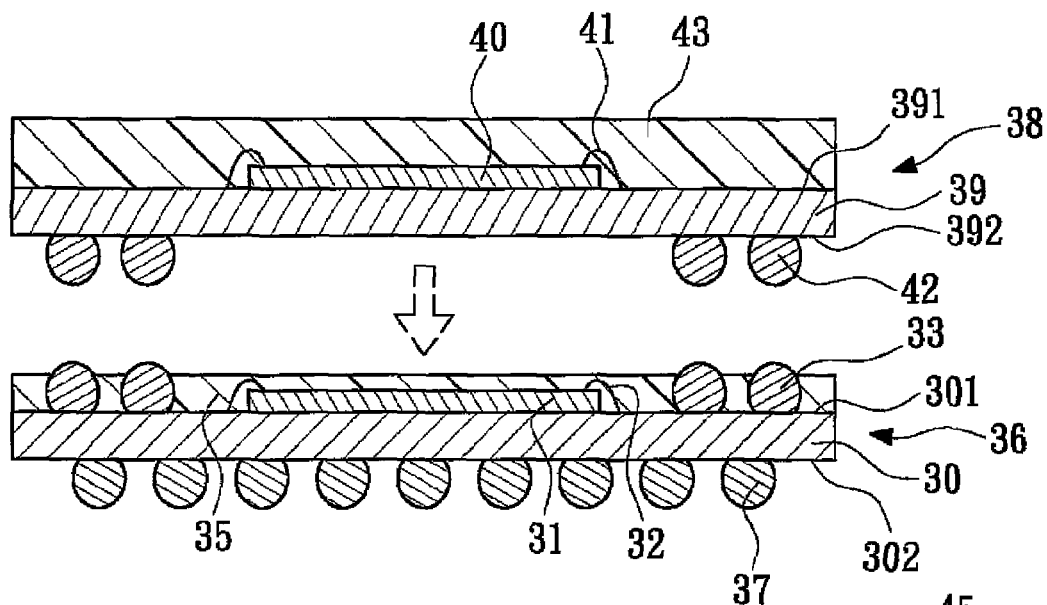

In FIG. 12, a second package 38 is provided. The second package 38 comprises a second substrate 39, a second chip 40, a plurality of third solder balls 42 and a second molding compound 43. The second substrate 39 has a first surface 391 and a second surface 392. The second chip 40 is electrically connected to the first surface 391 of the second substrate 39. In the embodiment, the second chip 40 is electrically connected to the first surface 391 of the second substrate 39 via a plurality of second wires 41. The third solder balls 42 are disposed on the second surface 392 of the second substrate 39. The second molding compound 43 encapsulates the second chip 40, the first surface 391 of the second substrate 39 and the second wires 41.

Figure 13:
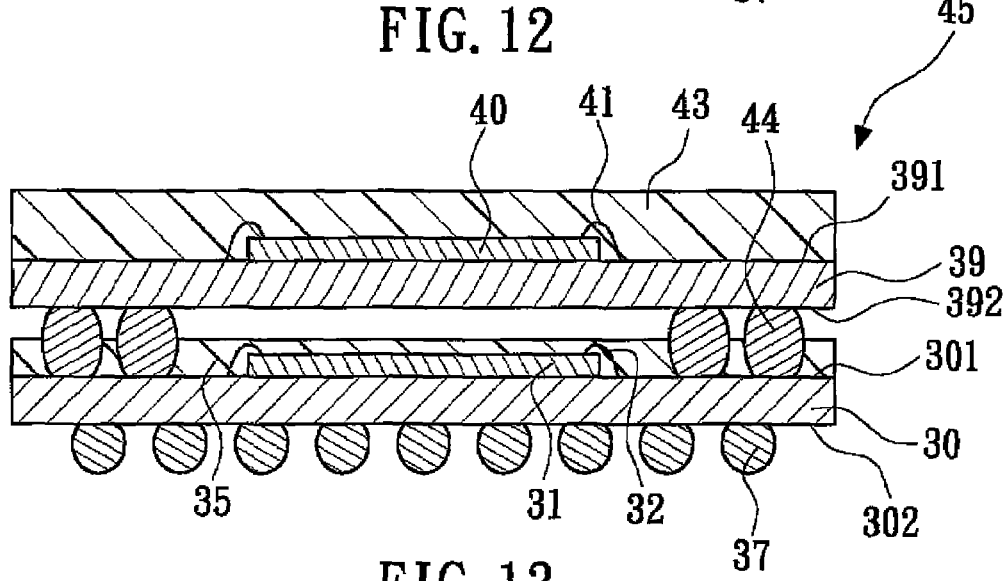

In FIG. 13, the third solder balls 42 are stacked on the conductive elements 33. Afterward, a reflow process is performed to form a plurality of fourth solder balls 44 by melting the third solder balls 42 and the conductive elements 33. Thus, a semiconductor package 45 is formed, and the semiconductor package 45 is a stacked semiconductor package.

In the embodiment, the second solder balls 37 (FIG. 11) are formed first, and the stacking process and the reflow process (FIGS. 12 and 13) are performed later. It is understood that the stacking process and the reflow process may be performed first, and the second solder balls 37 may be formed later on the second surface 302 of the substrate 30.

Again in FIG. 13, the semiconductor package 45 comprises a first substrate 30, a first chip 31, a second substrate 39, a second chip 40, a second molding compound 43, a plurality of fourth solder balls 44 and a first molding compound 35. The first substrate 30 has a first surface 301 and a second surface 302. The first chip 31 is mounted onto the first surface 301 of the first substrate 30, and is electrically connected to the first substrate 30 via a plurality of first wires 32. The second substrate 39 has a first surface 391 and a second surface 392. The second chip 40 is mounted onto the first surface 391 of the second substrate 39, and is electrically connected to the second substrate 39 via a plurality of second wires 41. The second molding compound 43 encapsulates the second chip 40, the first surface 391 of the second substrate 39 and the second wires 41.

The fourth solder balls 44 connect the second surface 392 of the second substrate 39 and the first surface 301 of the first substrate 30. The molding compound 36 encapsulates the first surface 301 of the first substrate 30, the first chip 31, the first wires 32 and parts of the fourth solder balls 44, and the height of the molding compound 35 is smaller than the height of each of the fourth solder balls 44, that is, the fourth solder balls 44 protrude out of the first molding compound 35.

Preferably, the semiconductor package 45 further comprises a plurality of second solder balls 37 disposed on the second surface 302 of the first substrate 30.

Figure 14:
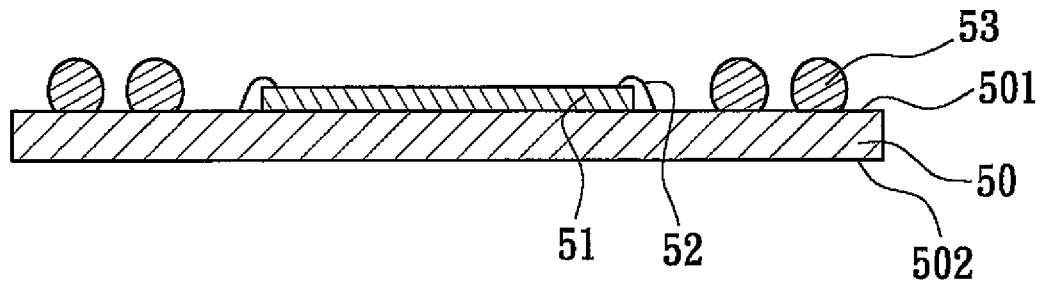
FIGS. 14 to 19 are schematic views of each step of the method of making a semiconductor package according to the second embodiment of the present invention.

FIGS. 14 to 19 are schematic views of each step of the method of making a semiconductor package according to the second embodiment of the present invention. In FIG. 14, a first substrate 50 is provided. The first substrate 50 has a first surface 501 and a second surface 502. A first chip 51 is mounted onto the first surface 501 of the first substrate 50, and is electrically connected to the first substrate 50. In the embodiment, the first chip 51 is electrically connected to the first substrate 50 via a plurality of first wires 52. Afterward, a plurality of conductive elements 53 is formed on the first surface 501 of the first substrate 50. In the embodiment, the conductive elements 53 are a plurality of first solder balls, which are spherical.

Figure 15:
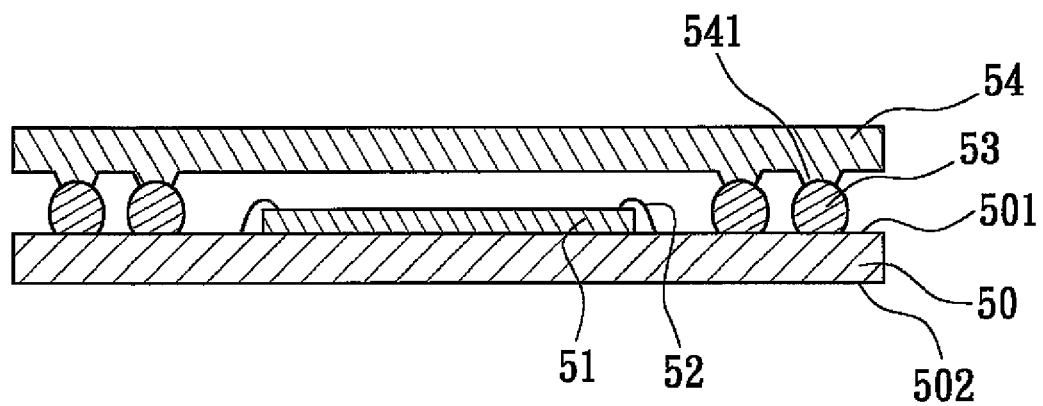

In FIG. 15, a mold 54 is used to cover the conductive elements 53. The mold 54 has a plurality of protrusions 541, and each of the protrusions 541 contacts top ends of each of the conductive elements 53.

Figure 16:
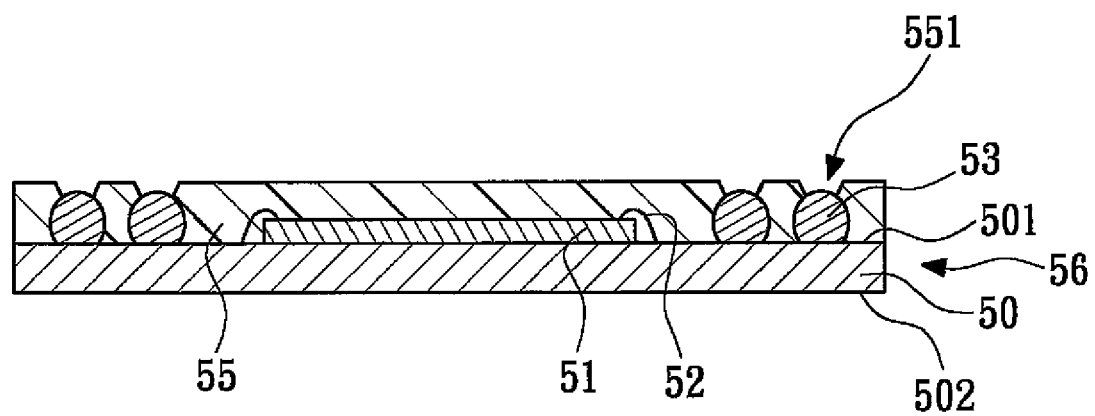

In FIG. 16, a molding process is performed to encapsulate the first surface 501 of the first substrate 50, the chip 51, the first wires 52 and parts of the conductive elements 53 by forming a first molding compound 55, and the height of the first molding compound 55 is greater than the height of each of the conductive elements 53. The first molding compound 55 has a plurality of cavities 551 to expose top ends of the conductive elements 53, and the shape of the cavities 551 corresponds to that of the protrusions 541. After the first molding compound 55 is solidified, the mold 54 is removed to form a first semiconductor package 56.

Also in FIG. 16, the first semiconductor package 56 comprises a first substrate 50, a first chip 51, a plurality of conductive elements 53 and a first molding compound 55. The first substrate 50 has a first surface 501 and a second surface 502. The first chip 51 is mounted onto the first surface 501 of the first substrate 50, and is electrically connected to the first substrate 50. In the embodiment, the first chip 51 is electrically connected to the first substrate 50 via a plurality of first wires 52.

The conductive elements 53 are disposed on the first surface 501 of the first substrate 50. In the embodiment, the conductive elements 53 are a plurality of first solder balls. The first molding compound 55 encapsulates the first surface 501 of the first substrate 50, the first chip 51 and parts of the conductive elements 53, wherein the height of the first molding compound 55 is greater than the height of each of the conductive elements 53, and the first molding compound 55 has a plurality of cavities 551 to expose top ends of the conductive elements 53.

The following processes may be further performed for the first semiconductor package 56.

Figure 17:
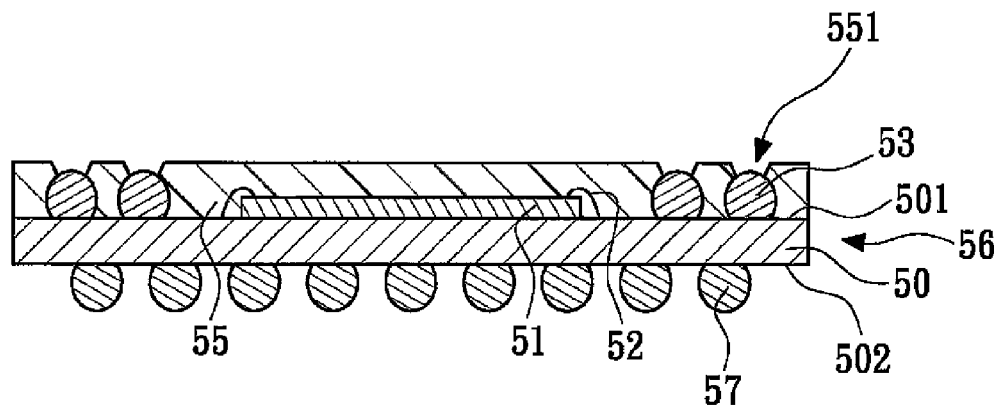

In FIG. 17, a plurality of second solder balls 57 is formed on the second surface 502 of the first substrate 50.

Figure 18:
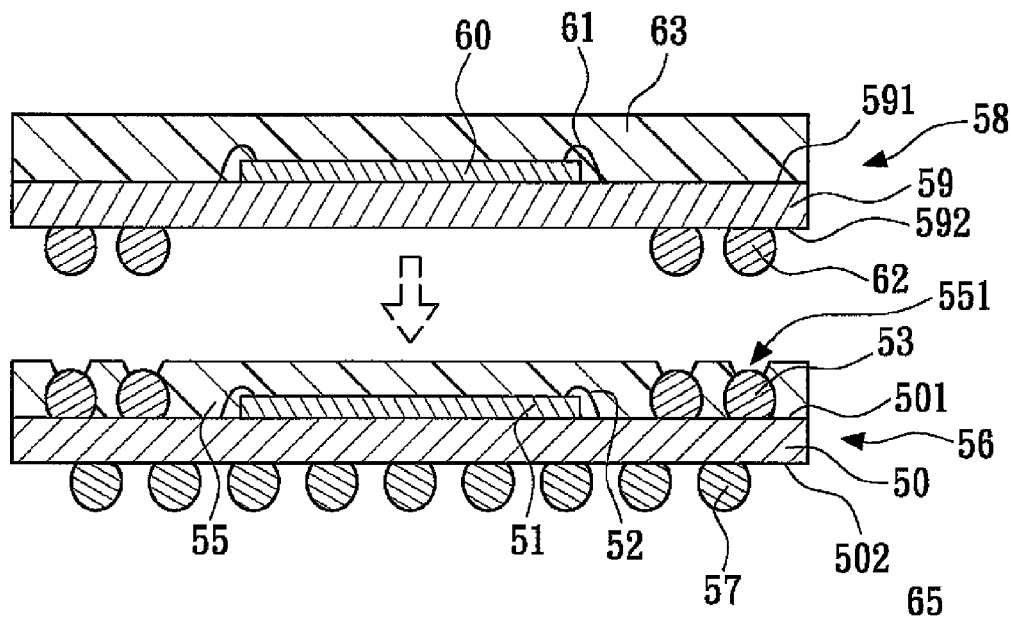

In FIG. 18, a second package 58 is provided. The second package 58 comprises a second substrate 59, a second chip 60, a plurality of third solder balls 62 and a second molding compound 63. The second substrate 59 has a first surface 591 and a second surface 592. The second chip 60 is electrically connected to the first surface 591 of the second substrate 59. The second chip 60 is electrically connected to the first surface 591 of the second substrate 59 via a plurality of second wires 61. The third solder balls 62 are disposed on the second surface 592 of the second substrate 59. The second molding compound 63 encapsulates the second chip 60, the first surface 591 of the second substrate 59 and the second wires 61.

Figure 19:
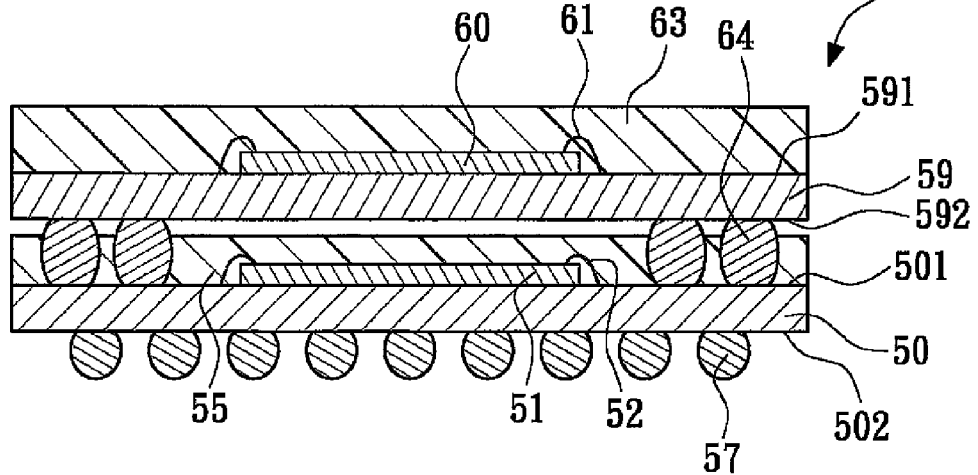

Also in FIG. 19, the third solder balls 62 are stacked on the conductive elements 53. Afterward, a reflow process is performed to form a plurality of fourth solder balls 64 by melting the third solder balls 62 and the conductive elements 53. Thus, a semiconductor package 65 is formed, and the semiconductor package 65 is a stacked semiconductor package.

In the embodiment, the second solder balls 57 (FIG. 17) are formed first, and the stacking process and the reflow process (FIGS. 18 and 19) are performed later. It is understood that the stacking process and the reflow process may be performed first, and the second solder balls 57 may be formed later on the second surface 502 of the first substrate 50.

In FIG. 19, the semiconductor package 65 comprises a first substrate 50, a first chip 51, a second substrate 59, a second chip 60, a second molding compound 63, a plurality of fourth solder balls 64 and a first molding compound 55. The first substrate 50 has a first surface 501 and a second surface 502. The first chip 51 is mounted onto the first surface 501 of the first substrate 50, and is electrically connected to the first substrate 50 via a plurality of first wires 52. The second substrate 59 has a first surface 591 and a second surface 592. The second chip 60 is mounted onto the first surface 591 of the second substrate 59, and is electrically connected to the second substrate 59 via a plurality of second wires 61. The second molding compound 63 encapsulates the second chip 60, the first surface 591 of the second substrate 59 and the second wires 61.

The fourth solder balls 64 connect the second surface 592 of the second substrate 59 with the first surface 501 of the first substrate 50. The first molding compound 55 encapsulates the first surface 501 of the first substrate 50, the chip 51, the first wires 52 and parts of the fourth solder balls 64, wherein the height of the first molding compound 55 is smaller than the height of each of the fourth solder balls 64, that is, the fourth solder balls 64 protrude out of the first molding compound 55.

Preferably, the semiconductor package 65 further comprises a plurality of second solder balls 57 disposed on the second surface 502 of the first substrate 50.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A method of making a semiconductor package, comprising:
    (a) providing a first substrate having a first surface and a second surface;
    (b) mounting a first chip onto the first surface of the first substrate, the first chip being electrically connected to the first substrate;
    (c) forming a plurality of conductive elements on the first surface of the first substrate;
    (d) covering the conductive elements with a mold, the mold having a plurality of protrusions, wherein covering the conductive elements with the mold includes aligning the mold with respect to the conductive elements such that the protrusions of the mold are contacting top ends of each of the conductive elements; and
    (e) forming a first molding compound for encapsulating the first surface of the first substrate, the first chip and parts of the conductive elements, wherein a height of the first molding compound is greater than a height of each of the conductive elements, and the first molding compound has a plurality of cavities to expose top ends of the conductive elements.

2. The method as claimed in claim 1, wherein after forming the first molding compound in (e), the method further comprises:
    (e1) forming a plurality of second solder balls on the second surface of the first substrate.

3. The method as claimed in claim 2, wherein after forming the second solder balls in (e1), the method further comprises:
    (f) providing a second package having a second substrate, a second chip and a plurality of third solder balls, the second substrate having a first surface and a second surface, the second chip being electrically connected to the first surface of the second substrate, and the third solder balls being disposed on the second surface of the second substrate;
    (g) stacking the third solder balls on the conductive elements; and
    (h) performing a reflow process to form a plurality of fourth solder balls by melting the third solder balls and the conductive elements.

4. The method as claimed in claim 3, wherein in providing the second package in (f), the second package further comprises a plurality of second wires and a second molding compound, the second wires electrically connecting the second chip and the second substrate, and the second molding compound encapsulating the second chip, the first surface of the second substrate and the second wires.

5. The method as claimed in claim 1, wherein after forming the first molding compound in (e), the method further comprises:
    (f) providing a second package having a second substrate, a second chip and a plurality of third solder balls, the second substrate having a first surface and a second surface, the second chip being electrically connected to the first surface of the second substrate, and the third solder balls being disposed on the second surface of the second substrate;
    (g) stacking the third solder balls on the conductive elements;
    (h) performing a reflow process to melt the third solder balls and the conductive elements; and
    (i) forming a plurality of fourth solder balls on the second surface of the first substrate.

6. The method as claimed in claim 5, wherein in providing the second package in (f), the second package further comprises a plurality of second wires and a second molding compound, the second wires electrically connecting the second chip and the second substrate, and the second molding compound encapsulating the second chip, the first surface of the second substrate and the second wires.

7. The method as claimed in claim 1, wherein shapes of the cavities of the first molding compound correspond to shapes of the protrusions of the mold.

8. A method of making a semiconductor package, comprising:
- providing a first substrate including a first surface and a second surface;
- mounting a first chip onto the first surface of the first substrate, the first chip being electrically connected to the first substrate;
- disposing a plurality of conductive elements on the first surface of the first substrate;
- covering the first chip and upper portions of the conductive elements with a mold;
- encapsulating the first chip and at least a hemispheric portion of each of the conductive elements with a molding compound, wherein the each of the conductive elements are substantially spherical prior to a reflow; and
- removing the mold, wherein a plurality of cavities are formed in the molding compound to expose the upper portions of the conductive elements.

9. The method as claimed in claim 8, wherein covering the upper portions of the conductive elements with the mold includes contacting the mold with the upper portions of the conductive elements.

10. The method as claimed in claim 8, wherein the mold includes a plurality of protrusions, and covering the upper portions of the conductive elements with the mold includes aligning the mold with respect to the conductive elements such that the protrusions of the mold are contacting the upper portions of the conductive elements.

11. The method as claimed in claim 10, wherein shapes of the cavities of the molding compound correspond to shapes of the protrusions of the mold.

12. The method as claimed in claim 8, further comprising:
- providing a second package including a second substrate, a second chip, and a plurality of solder balls, the second substrate including a first surface and a second surface, the second chip being mounted onto the first surface of the second substrate, and the solder balls being disposed on the second surface of the second substrate;
- stacking the solder balls on the conductive elements; and
- performing a reflow process to melt the solder balls and the conductive elements to form reflowed solder balls.

13. The method as claimed in claim 12, wherein at least one of the reflowed solder balls extends between the second surface of the second substrate and the first surface of the first substrate, and a lateral boundary of the at least one of the reflowed solder balls is shaped with a substantial absence of an inward indentation.

14. The method as claimed in claim 13, wherein the lateral boundary of the at least one of the reflowed solder balls is convex.

15. The method as claimed in claim 8, wherein the molding compound circumscribes each of the plurality of cavities.

16. A semiconductor package, comprising:
- a first substrate, including a first surface and a second surface;
- a first chip, disposed on the first surface of the first substrate and electrically connected to the first substrate;
- a plurality of conductive elements, disposed on the first surface of the first substrate; and
- a molding compound, encapsulating the first surface of the first substrate, the first chip, and parts of the conductive elements, wherein the molding compound defines a plurality of cavities to expose top ends of the conductive elements, and wherein the conductive elements are arranged as an inner row of conductive elements, at least partially surrounding the first chip, and an outer row of conductive elements, at least partially surrounding the inner row of conductive elements.

17. The semiconductor package as claimed in claim 16, wherein a height of the molding compound is greater than a height of each of the conductive elements.

18. The semiconductor package as claimed in claim 16, wherein shapes of the cavities of the molding compound correspond to shapes of protrusions of a mold.

19. The semiconductor package as claimed in claim 16, further comprising:
- a second substrate, including a first surface and a second surface;
- a second chip, disposed on the first surface of the second substrate and electrically connected to the second substrate; and
- a plurality of solder balls, electrically connected to the second surface of the second substrate and stacked on the conductive elements.

20. The semiconductor package as claimed in claim 19, wherein, after a reflow process, the solder balls and the conductive elements are joined to form reflowed solder balls, and a lateral boundary of at least one of the reflowed solder balls is shaped with a substantial absence of an inward indentation.

21. The semiconductor package as claimed in claim 16, wherein a surface roughness of the cavities of the molding compound is based on protrusions of a mold.

* * * * *